United States Patent
Ghosh et al.

(10) Patent No.: US 10,727,852 B2
(45) Date of Patent: Jul. 28, 2020

(54) REDUCED NOISE DYNAMIC COMPARATOR FOR A SUCCESSIVE APPROXIMATION REGISTER ANALOG-TO-DIGITAL CONVERTER

(71) Applicant: TEXAS INSTRUMENTS INCORPORATED, Dallas, TX (US)

(72) Inventors: Sovan Ghosh, Paschim Medinipur (IN); Amal Kumar Kundu, Bengaluru (IN); Janakiraman Seetharaman, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/555,265

(22) Filed: Aug. 29, 2019

(65) Prior Publication Data

US 2019/0386670 A1 Dec. 19, 2019

Related U.S. Application Data

(63) Continuation of application No. 15/837,040, filed on Dec. 11, 2017, now Pat. No. 10,447,290.

(51) Int. Cl.
*H03K 5/00* (2006.01)
*H03M 1/08* (2006.01)
*H03K 5/24* (2006.01)

(52) U.S. Cl.
CPC .......... *H03M 1/089* (2013.01); *H03K 5/2481* (2013.01)

(58) Field of Classification Search
CPC .............................. H03M 1/089; H03K 5/2481

(Continued)

(56) References Cited

U.S. PATENT DOCUMENTS 5,355,391 A * 10/1994 Horowitz ............ G06F 13/4072
326/30
5,977,798 A * 11/1999 Zerbe ................ H03K 3/356121
326/115

(Continued)

FOREIGN PATENT DOCUMENTS

CN 105162441 12/2015
CN 107094006 8/2017

(Continued)

OTHER PUBLICATIONS

International Search Report in corresponding PCT Application No. PCT/2018/064965, dated Apr. 4, 2019 (2 pages).

*Primary Examiner* — Ryan Jager
(74) *Attorney, Agent, or Firm* — John R. Pessetto; Charles A. Brill; Frank D. Cimino

(57) ABSTRACT

A comparator circuit includes a first transistor configured to receive a first input and a second transistor configured to receive a second input. The comparator circuit further includes a third transistor coupled to a terminal of each of the first and second transistors. The third transistor is configured to be controlled by a first control signal. A gate of a fifth transistor is coupled to a terminal of a fourth transistor at a first node and a gate of the fourth transistor is coupled to a terminal of the fifth transistor at a second node. A sixth transistor is coupled between the first and fourth transistors. A seventh transistor is coupled between the second and fifth transistors. A gate of the sixth transistor and a gate of the seventh transistor are coupled together at a fixed voltage level.

4 Claims, 4 Drawing Sheets

(58) Field of Classification Search
USPC .......................................................... 327/50
See application file for complete search history.

(56) References Cited

U.S. PATENT DOCUMENTS

| | | | | |
|---|---|---|---|---|
| 6,147,514 | A * | 11/2000 | Shiratake | G11C 7/065 327/55 |
| 6,310,501 | B1 * | 10/2001 | Yamashita | H03K 3/356139 327/211 |
| 6,580,411 | B1 * | 6/2003 | Kubota | G09G 3/3677 345/100 |
| 6,788,112 | B1 * | 9/2004 | Chan | G11C 7/062 327/51 |
| 7,196,699 | B1 * | 3/2007 | Kubota | G09G 3/3677 345/100 |
| 7,368,969 | B2 * | 5/2008 | Suzuki | H02M 3/07 327/333 |
| 7,511,556 | B2 * | 3/2009 | Liu | H03K 3/356139 326/62 |
| 9,069,652 | B2 * | 6/2015 | Yeung | G06F 12/00 |
| 9,972,394 | B2 | 5/2018 | Conte et al. | |
| 2008/0074148 | A1 * | 3/2008 | Srivastava | H03K 3/012 326/68 |
| 2009/0066157 | A1 * | 3/2009 | Tarng | H03B 5/04 307/31 |
| 2010/0117697 | A1 * | 5/2010 | Kanno | G06F 1/10 327/158 |
| 2018/0183422 | A1 * | 6/2018 | Yasotharan | H03K 5/249 |

FOREIGN PATENT DOCUMENTS

| | | |
|---|---|---|
| SU | 411429 | 1/1974 |
| SU | 1688398 | 10/1991 |

* cited by examiner

REDUCED NOISE DYNAMIC COMPARATOR FOR A SUCCESSIVE APPROXIMATION REGISTER ANALOG-TO-DIGITAL CONVERTER

CROSS REFERENCE TO RELATED APPLICATION(S)

This continuation claims priority to U.S. patent application Ser. No. 15/837,040, filed Dec. 11, 2017, which application is incorporated herein by reference in its entirety.

BACKGROUND

Comparators are used in a variety of applications. For example, a successive approximation register digital-to-analog converter (SAR ADC) uses a comparator to compare an input voltage to be converted to digital form to a programmable reference voltage. Zero static power SAR ADCs can be used for a wide range of conversion throughput rates. Power consumption of the ADC scales linearly with throughput. Some comparators in SAR ADCs may include a pre-amplifier to boost the input signal level before providing the input signal to a latch, but pre-amplifiers consume power regardless of the throughput of the ADC. Dynamic comparators may introduce a significantly high level of kickback noise. Thermal noise may be present in an ADC which may necessitate a design trade-off between conversion speed and noise. That is, one ADC may be faster than another, but the faster ADC may be characterized by higher levels of thermal noise. Thermal noise of the dynamic comparator causes degradation in the signal-to-noise ratio (SNR), and kickback noise introduces a second or third order non-linearity in the input-to-output conversion relationship.

SUMMARY

In one example, a comparator circuit includes eight transistors. A first transistor is configured to receive a first and a second transistor is configured to receive a second input. A third transistor is coupled to a terminal of each of the first and second transistors. The third transistor is configured to be controlled by a first control signal. A fourth transistor is coupled to the first transistor at a first node. A fifth transistor is coupled to the second transistor at a second node. A gate of the fifth transistor is coupled to the first node and a gate of the fourth transistor is coupled to the second node. A sixth transistor is coupled to the first node. A gate of the sixth transistor is coupled to the second node. A seventh transistor is coupled to the second node. A gate of the seventh transistor is coupled to the first node. An eighth transistor is coupled to a terminal of each of the sixth and seventh transistors. The eighth transistor is configured to be controlled by a second control signal having an edge that is delayed from a corresponding edge of the first control signal.

In another example, a comparator circuit includes a first transistor configured to receive a first input and a second transistor configured to receive a second input. The comparator circuit further includes a third transistor coupled to a terminal of each of the first and second transistors. The third transistor is configured to be controlled by a first control signal. A gate of a fifth transistor is coupled to a terminal of a fourth transistor at a first node and a gate of the fourth transistor is coupled to a terminal of the fifth transistor at a second node. A sixth transistor is coupled between the first and fourth transistors. A seventh transistor is coupled between the second and fifth transistors. A gate of the sixth transistor and a gate of the seventh transistor are coupled together at a fixed voltage level.

In yet another example, a comparator circuit includes a first transistor configured to receive a first input and a second transistor configured to receive a second input. A third transistor is coupled to a terminal of each of the first and second transistors. The third transistor is configured to be controlled by a first control signal. A transistor switch is coupled between drains of the first and second transistors. A fourth transistor including a gate and a drain is included in the comparator circuit as well. A fifth transistor also includes a gate and a drain. The gate of the fifth transistor is coupled to the drain of the fourth transistor and the gate of the fourth transistor is coupled to the drain of the fifth transistor. A sixth transistor is included and comprises a drain and a gate. The drains of the fourth and sixth transistors are coupled together. A gate of the sixth transistor is coupled to the drain of the fifth transistor. A seventh transistor includes a drain and a gate, and the drains of the fifth and seventh transistors are coupled together. A gate of the seventh transistor is coupled to the drain of the fourth transistor. An eighth transistor is coupled to a terminal of each of the sixth and seventh transistors. The eighth transistor is configured to be controlled by a second control signal having an edge that is delayed from a corresponding edge of the first control signal.

BRIEF DESCRIPTION OF THE DRAWINGS

For a detailed description of various examples, reference will now be made to the accompanying drawings in which.

DETAILED DESCRIPTION

Figure 1:
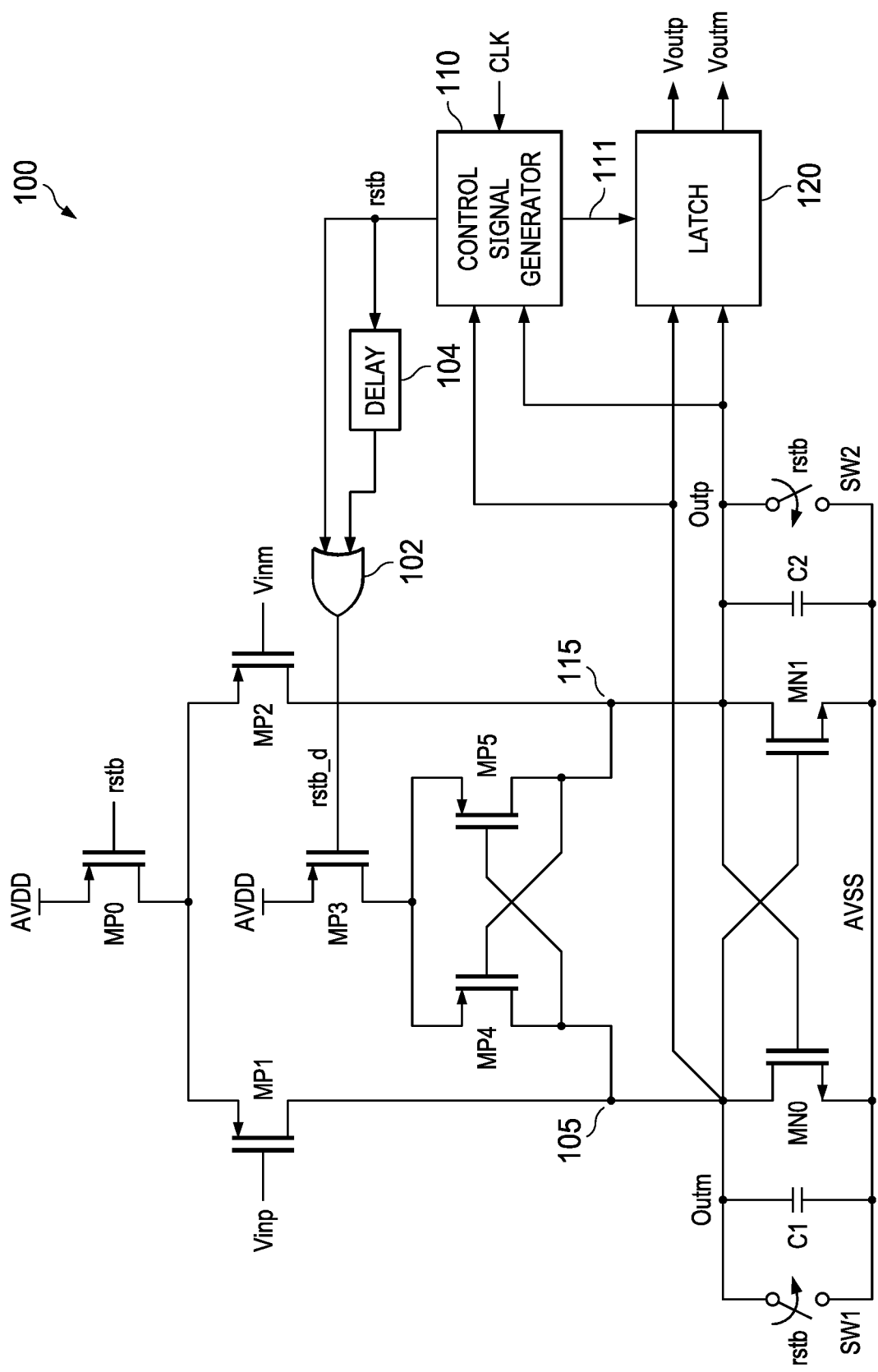
FIG. 1 illustrates an example of a comparator which reduces the effects of thermal noise in accordance with an illustrative embodiment.

FIG. 1 shows an example of a comparator circuit 100. In this example, the comparator circuit comprises transistors MP0, MP1, MP2, MP3, MP4, MP5, MN0, and MN1, transistor switches SW1 and SW2, capacitors C1 and C2, OR gate 102, delay 104, control signal generator 110, and latch 120. The inputs being compared together by the comparator circuit 100 is shown as Vinp and Vinm and the output of the comparator is represented as Outp and Outm. Outp is high and Outm is low if Vinp is larger than Vinm, and Outp is low and Outm is high if Vinp is smaller than Vinm. Using a control signal 111 from the control signal generator 110, the latch 120 latches Outp and Outm as output signals Voutp and Voutm, respectively.

In the example of FIG. 1, MP0, MP1, MP2, MP3, MP4, and MP5 comprise p-type metal oxide semiconductor field effect transistors (MOSFETs) and MN0 and MN1 comprise n-type MOSFETS. The doping type of the transistors can be different from that shown in FIG. 1 in other embodiments. As MOSFETs, the transistors have a gate, a drain, and a source (sometimes referred to as terminals herein). MP1 is configured to receive input Vinp, and MP2 is configured to receive input Vinm. The sources of MP1 and MP2 are coupled together as shown and to the drain of MP0. The source of MP0 is coupled to a supply voltage AVDD. The gate of MP0 is controlled by a control signal designated as rstb in FIG. 1. Rstb is generated by the control signal generator 110 based on an input clock signal (CLK).

The drain of MN0 is coupled to the drain of MP1 thereby defining a node 105. Similarly, the drain of MN1 is coupled to the drain of MP2 thereby defining a node 115. The gate of MN1 is coupled to node 105 and the gate of MN0 is coupled to node 115. Capacitor C1 is coupled in parallel across MN0 (i.e., between MN0's drain and source terminals). Transistor switch SW1 is coupled in parallel to C1 as well. When SW1 is closed (e.g., turned on and conducting current), node 105 and thus Outm is pulled low to approximately the same potential as AVSS. Similarly, capacitor C2 is coupled in parallel across MN1 (i.e., between MN1's drain and source terminals). Transistor switch SW2 is coupled in parallel to C2. When SW2 is closed, node 115 and thus Outp is pulled low to approximately the same potential as AVSS. SW1 and SW2 are also controlled by rstb. Thus, when rstb is a logic high, both SW1 and SW2 close resetting the output signals Outp and Outm to a logic low level. With rstb low, Outp and Outm are caused to transition high or low depending on the relative voltage levels of Vinp and Vinm.

If Vinp is larger than Vinm, and with rstb low and thus MP0 on, current flows through MP0 and through each of MP1 and MP2, but more current flows through MP2 than MP1 if Vinp is larger than Vinm or more current flows through MP1 than MP2 if Vinm is larger than Vinp. In the case in which more current flows through MP2 than MP1 (Vinp is larger than Vinm), the voltage on node 115 begins to rise faster than the voltage on node 105. Because node 115 is coupled to the gate of MN0, MN0 begins to turn on sooner than MN1. The cross-coupled configuration of MN0 and MN1 (drain of MN1 coupled to gate of MN0, and drain of MN0 coupled to gate of MN1), provides positive feedback to reinforce the voltage on node 115 (i.e., Outp) being larger than the voltage on node 105 (i.e., Outm). The circuit works similarly when Vinm is greater than Vinp generating Outm to be a larger voltage than Outp.

MP4 and MP5 are also provided to accelerate the regeneration of the voltage on nodes 105 and 115. MP4 and MP5 are sized appropriately to ensure that a sufficiently high regenerative transconductance when rstb_d goes low. The sources of MP4 and MP5 are coupled together and to the drain of MP3. The source of MP3 is coupled to AVDD. A control signal labeled as rstb_d is provided to the gate of MP3 and determines whether MP3 is on or off. The drain of MP4 is coupled to node 105 and to the gate of MP5. Similarly, the drain of MP5 is coupled to node 115 and to the gate of MP4. Transistors MP4 and MP5 work in concert with MN0 and MN1 to reinforce the voltages on nodes 105 and 115. For example, if Vinp is greater than Vinm, the voltage on node 115 becomes higher than on node 105 as discussed above. With the voltage on node 115 at an elevated level compared to the voltage on node 105, MP5 begins to turn on faster than MP4 thereby permitting additional current to flow from AVDD, through MP3 and MP5 to node 115, and thus to further reinforce MN0 being on.

The clock signal CLK is provided to the control signal generator 110 which generates the control signal 111 for the latch, and rstb as well. The delay 104 receives rstb and delays it by a predetermined amount of time. The amount of delay is application specific and may depend on the desired speed of the comparator circuit 100. The output of delay 104 and rstb are provided as inputs to OR gate 102. The output of OR gate 102 is high when either rstb is high or the output of delay 104 is high. The output of the OR gate is the rstb_d control signal for the gate of MP3. The relative timing between CLK, rstb, and rstb_d is shown in FIG. 2 and discussed below.

Figure 2:
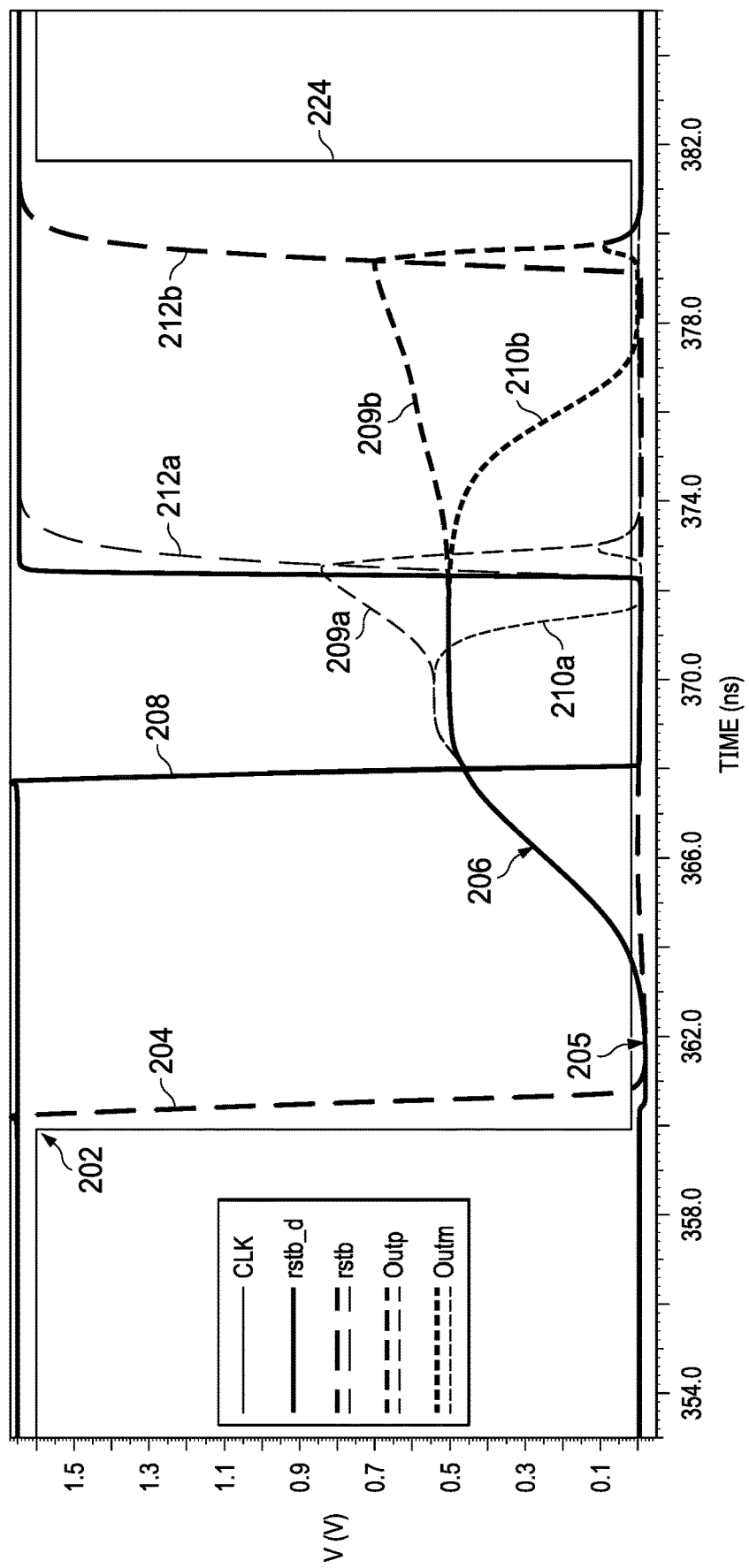
FIG. 2 shows a timing diagram of the comparator of FIG. 1.

Referring now to FIG. 2, CLK is illustrated with a falling edge at 202 and a rising edge at 204. The control signal generator 110 generates rstb to have a falling edge 224 generally coincident with the falling edge of CLK. With CLK and thus rstb high, switches SW1 and SW2 are closed thereby resetting the comparator circuit 100 (Outm and Outp are both forced low). With rstb being high, rstb_d from OR gate 102 also is high. Upon rstb transitioning to a logic low level as exemplified at 205, MP0 turns on and SW1 and SW2 turn off. Outm and Outp begin to rise as noted above as charge begins to accumulate on the gates of MN0 and MN1 due to current flowing through MP2 and MP1, respectively. Once rstb becomes low, one input to the OR gate is low. The other OR gate input from the delay 104 remains high for a period of time equal to the time delay implemented by delay 104. The time delay is preconfigured in the delay 104. Once the output of the delay 104 also becomes low, the output of the OR gate 102, which is rstb_d becomes low (as shown at 208), thereby turning on MP3. With MP3 on, additional current flows to one or the other of MN0 and MN1 to reinforce whichever of MN0 and MN1 is being turned on faster due to the relative voltage levels of Vinp and Vinm as described above.

The dashed line 209a depicts the continued rate of change of Outp and the dashed line 210a depicts the continued rate of change of Outm. Dashed lines 209b and 210b depict what would have been the continued rate of change of Outp and Outm, respectively, absent the accelerated affect from transistors MP4 and MP5. As can be seen, the comparator generates the Outp and Outm final values at a faster rate and sooner using transistors MP4 and MP5. Once Outp and Outm reach their final values, the control signal generator 110 asserts rstb high as shown by dashed rising edge 212a. With rstb high, rstb_d also is forced high by OR gate 102 which causes MP3 to turn off. Further, with rstb high, MP0 is turned off and switches SW1 an SW2 are closed thereby resetting the comparator circuit 100. The comparator circuit 100 resets sooner than would have been the case had rstb been forced high at 212b which would have been the case absent the accelerated affect from transistors MP4 and MP5.

Thermal noise of the comparator is inversely proportional to the time delay. Thermal noise can be reduced by slowing down the initial phase of integration of node 105, 115 (common mode rising time of 205, 206) but this will slow down the regeneration phase resulting in a slow response time for the comparator. The additional circuit comprising MP3, MP4, and MP5 accelerates the regeneration phase without affecting the initial integration time. Thus, for a constant delay more time can be allocated for common mode integration phase resulting in a better thermal noise performance of the comparator.

Figure 3:
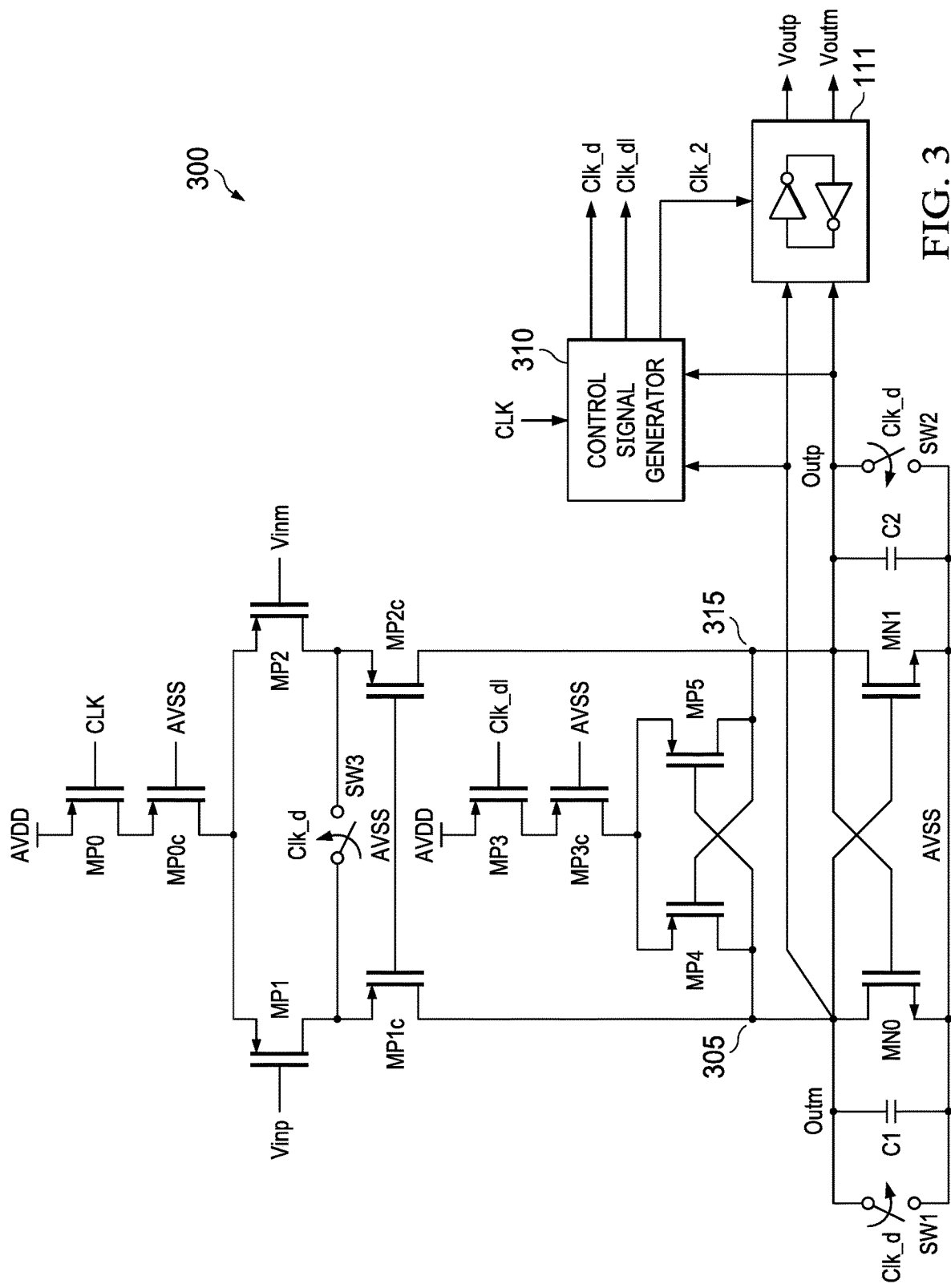
FIG. 3 illustrates an example of a comparator which reduces the effects of kickback and thermal noise in accordance with an illustrative embodiment.

FIG. 3 shows a comparator circuit 300 in accordance with another embodiment. Comparator circuit 300 has some similarities to comparator circuit 100 of FIG. 1. For example, as for comparator circuit 100, comparator circuit 300 includes transistors MP1 MP2, MP3, MP4, MP5, MN0, and MN1, capacitors C1 and C2, transistor switches SW1 and SW2 coupled together as described above with regard to comparator 100. Comparator circuit 300 also includes cascode transistors MP0c and MP3C as shown to reduce the kick-back noise. MP0c reduces the transient glitch (step change) at the source of transistors MP1 and MP2 at every falling edge of CLK, whereas MP3c performs the same function for MP4 and MP5. Any transient glitches at the sources of MP1 and MP2 couple to Vinp and Vinm through parasitic capacitance between the source and gate of MP1 and MP2 which can potentially override the actual differential input resulting possibly in a wrong decision of the comparator. This effect is called kickback noise for a dynamic comparator.

Further, comparator circuit 300 includes cascode transistor MP1c coupled between MP1 and MN0. The connection between MP1c and MN0 is labeled as node 305 and provides the output signal Outm. MP1c in this example is a p-type MOSFET. Similarly, comparator circuit 300 includes cascode transistor MP2c coupled between MP2 and MN1. The connection between MP2c and MN1 is labeled as node 315 and provides the output signal Outp. MP2c in this example also is a p-type MOSFET. A transistor switch SW3 couples together the drains of MP1 and MP2, and the sources of cascode transistors MP1c and MP2c. MP1c reduces the transient voltage at the drain of MP1 at the fall edge of CLK. This will reduce the kickback to Vinp through the drain to gate capacitance of MP1. MP2c helps to reduce the kickback through MP2 in a similar manner.

In the example of FIG. 3, a clock signal (CLK) is provided to a control signal generator 310, which generates additional control signals Clk_d, Clk_dl, and Clk_2. The clock signal CLK is used to control the state of MP0, while Clk_d controls the state of switches SW1-SW3. Control signal Clk_dl controls the state of MP3 and Clk_2 controls the latch 120, which latches the output signals Outp and Outm as Voutp and Voutm, respectively.

Figure 4:
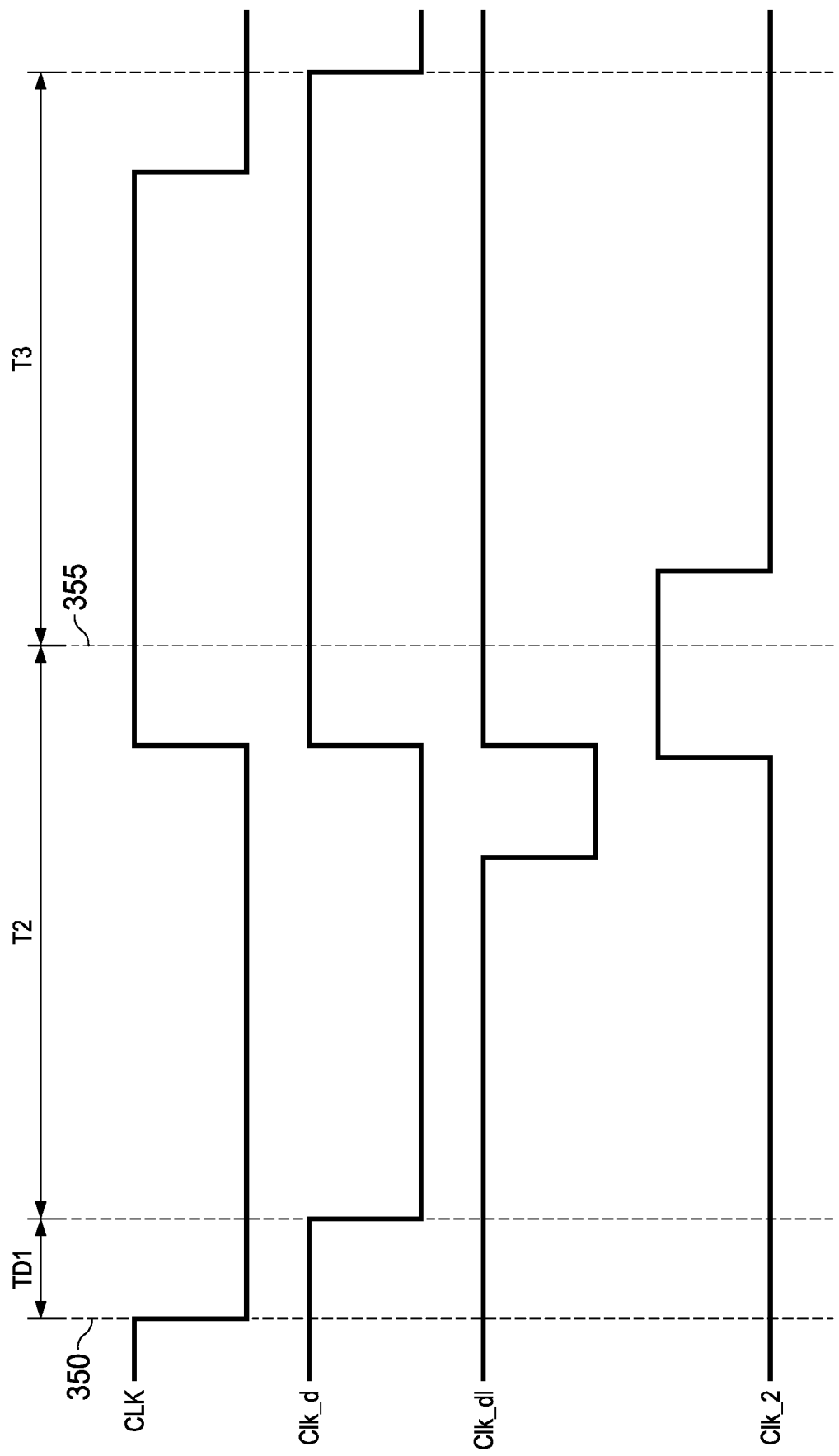
FIG. 4 shows a timing diagram of the comparator of FIG. 3.

FIG. 4 shows the timing diagram for the relevant control signals CLK, Clk_d, Clk_dl, and Clk_2. Upon CLK transitioning to a logic low level at 350, the control signal generator 310 asserts Clk_d low as well but after a time delay designated as TD1 in FIG. 4. TD1 may be preconfigured using a delay circuit within the control signal generator 310. The length of TD1 provides sufficient time for kickback noise to reduce to a sufficiently low level. While Clk_d is high, SW1-SW3 are all closed. Once Clk_d becomes low, SW1-SW3 open and the comparator circuit 300 is able to begin to generate the comparison decision (whether Outp is high and Outm is low, or vice versa) during time period T2. Outp and Outm are finalized at 355, followed by a time period T3 before the next cycle starts in which a capacitive digital-to-analog converter (CDAC) has sufficient time to settle before the next comparator generation within a SAR ADC.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A comparator circuit, comprising:
   a first transistor configured to receive a first input;
   a second transistor configured to receive a second input;
   a third transistor coupled to a terminal of each of the first and second transistors, wherein the third transistor is configured to be controlled by a first control signal;
   a fourth transistor;
   a fifth transistor, wherein a gate of the fifth transistor is coupled to a terminal of the fourth transistor at a first node and a gate of the fourth transistor is coupled to a terminal of the fifth transistor at a second node; and
   a sixth transistor coupled between the first and fourth transistors; and
   a seventh transistor coupled between the second and fifth transistors;
   wherein a gate of the sixth transistor and a gate of the seventh transistor are coupled together at a fixed voltage level;
   further comprising:
   a first capacitor coupled in parallel with the fourth transistor;
   a second capacitor coupled in parallel with the fifth transistor;
   a first transistor switch coupled in parallel with the first capacitor; and
   a second transistor switch coupled in parallel with the second capacitor.

2. The comparator circuit of claim 1, wherein the first transistor switch is controlled by a second control signal having an edge that is delayed from the edge of the first control signal.

3. A system comprising:
   an analog-to-digital converter (ADC), the ADC comprising:
      a comparator circuit, the comparator circuit comprising:
      a first transistor configured to receive a first input;
      a second transistor configured to receive a second input;
      a third transistor coupled to a terminal of each of the first and second transistors, wherein the third transistor is configured to be controlled by a first control signal;
      a fourth transistor;
      a fifth transistor, wherein a gate of the fifth transistor is coupled to a terminal of the fourth transistor at a first node and a gate of the fourth transistor is coupled to a terminal of the fifth transistor at a second node; and
      a sixth transistor coupled between the first and fourth transistors; and
      a seventh transistor coupled between the second and fifth transistors;
      wherein a gate of the sixth transistor and a gate of the seventh transistor are coupled together at a fixed voltage level;
      further comprising:
      a first capacitor coupled in parallel with the fourth transistor;
      a second capacitor coupled in parallel with the fifth transistor;
      a first transistor switch coupled in parallel with the first capacitor; and a second transistor switch coupled in parallel with the second capacitor.

4. The system of claim 3, wherein the first transistor switch is controlled by a second control signal having an edge that is delayed from the edge of the first control signal.

* * * * *